(12) United States Patent
Oraw

(10) Patent No.: US 9,657,903 B2
(45) Date of Patent: May 23, 2017

(54) GEOMETRICAL LIGHT EXTRACTION STRUCTURES FOR PRINTED LEDS

(71) Applicant: Nthdegree Technologies Worldwide Inc., Tempe, AZ (US)

(72) Inventor: Bradley Steven Oraw, Chandler, AZ (US)

(73) Assignee: Nthdegree Technologies Worldwide Inc., Tempe, AZ (US)

(*) Notice: Subject to any disclaimer, the term of this patent is extended or adjusted under 35 U.S.C. 154(b) by 166 days.

(21) Appl. No.: 14/462,881

(22) Filed: Aug. 19, 2014

(65) Prior Publication Data

US 2015/0054003 A1    Feb. 26, 2015

Related U.S. Application Data

(60) Provisional application No. 61/867,684, filed on Aug. 20, 2013.

(51) Int. Cl.
| | |
|---|---|
| *F21K 9/00* | (2016.01) |
| *H01L 33/42* | (2010.01) |
| *H01L 25/075* | (2006.01) |
| *H01L 33/44* | (2010.01) |

(52) U.S. Cl.
CPC ............ *F21K 9/00* (2013.01); *H01L 25/0753* (2013.01); *H01L 33/42* (2013.01); *H01L 33/44* (2013.01); *H01L 2924/0002* (2013.01)

(58) Field of Classification Search
CPC ........................................................ F21K 9/00
See application file for complete search history.

(56) References Cited

U.S. PATENT DOCUMENTS

| | | | |
|---|---|---|---|
| 2005/0214963 A1 | 9/2005 | Daniels et al. | |
| 2012/0162995 A1* | 6/2012 | Levermore | ......... H01L 51/5268 362/311.02 |
| 2012/0268932 A1* | 10/2012 | Lerman | ................... F21V 29/70 362/235 |

* cited by examiner

*Primary Examiner* — Andrew Coughlin
*Assistant Examiner* — Zachary J Snyder
(74) *Attorney, Agent, or Firm* — Patent Law Group LLP; Brian D. Ogonowsky

(57) ABSTRACT

A method of forming a light sheet includes depositing a reflective conductor layer over a substrate, printing a layer of microscopic inorganic LEDs on the conductor layer, depositing a first dielectric layer, having a first index of refraction, over the conductor layer and along sidewalls of the LEDs, and depositing a transparent conductor layer over the LEDs so that the LEDs are connected in parallel. The transparent conductor layer may be a wire mesh with openings. A liquid or paste polymer layer is then deposited over the transparent conductor layer and directly contacts the first dielectric layer. The indices of refraction of both layers are similar to reduce TIR. The top surface of the polymer layer is then molded to contain light extraction features to reduce waveguiding in the light sheet. In another embodiment, the substrate surface is the light exit surface that has the light extraction features.

20 Claims, 7 Drawing Sheets

GEOMETRICAL LIGHT EXTRACTION STRUCTURES FOR PRINTED LEDS

CROSS-REFERENCE TO RELATED APPLICATIONS

This application is based on U.S. provisional application Ser. No. 61/867,684, filed Aug. 20, 2013, by Bradley S. Oraw, assigned to the present assignee and incorporated herein by reference.

FIELD OF THE INVENTION

This invention relates to a light sheet having an array of printed light emitting diodes (LEDs) and, in particular, to techniques for improving the light extraction from such light sheets.

BACKGROUND

The present assignee has previously invented a flat light sheet formed by printing microscopic vertical LED dice over a conductor layer on a flexible substrate to electrically contact the LED's bottom electrodes, then printing a thin dielectric layer over the conductor layer which exposes the LED's top electrodes, then printing a transparent conductor layer to contact the LED's top electrodes to connect them in parallel. The LEDs may be printed to have a large percentage of the LEDs with the same orientation so the light sheet may be driven with a DC voltage. The light sheet may have a thickness between 5-13 mils, which is on the order of the thickness of a sheet of paper or cloth.

FIGS. 1 and 2 illustrates such a light sheet 10. The shape of the light sheet 10 and the pattern of printed LEDs may be customized for a particular application.

In FIG. 1, a starting substrate 11 may be polycarbonate, PET (polyester), PMMA, Mylar or other type of polymer sheet, or even a thin metal film, paper, cloth, or other material. In one embodiment, the substrate 11 is about 25-50 microns thick.

A conductor layer 12 is then deposited over the substrate 11, such as by printing. The substrate 11 and/or conductor layer 12 may be reflective if the light from the LEDs is to only be emitted from the opposite side. For example, the conductor layer 12 may be a printed aluminum layer or a laminated aluminum film. Alternatively, a reflective layer may be first laminated over the substrate 11 followed by printing a transparent conductor layer 12 over the reflective film. A reflective film, including a white diffusing paint, may also be provided on the back surface of the substrate 11.

A monolayer of microscopic inorganic LEDs 14 is then printed over the conductor layer 12. The LEDs 14 are vertical LEDs and include standard semiconductor GaN layers, including an n-layer, and active layer, and a p-layer. GaN LEDs typically emit blue light. The LEDs 14, however, may be any type of LED emitting red, green, yellow, or other color light.

The GaN-based micro-LEDs are less than a third the diameter of a human hair and less than a tenth as high, rendering them essentially invisible to the naked eye when the LEDs are sparsely spread across the substrate 11 to be illuminated. This attribute permits construction of a nearly or partially transparent light-generating layer made with micro-LEDs. In one embodiment, the LEDs 14 have a diameter less than 50 microns and a height less than 10 microns. The number of micro-LED devices per unit area may be freely adjusted when applying the micro-LEDs to the substrate 11. A well dispersed random distribution across the surface can produce nearly any desirable surface brightness. Lamps well in excess of 10,000 cd/m$^2$ have been demonstrated by the assignee. The LEDs may be printed as an ink using screen printing or other forms of printing. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

In one embodiment, an LED wafer, containing many thousands of vertical LEDs, is fabricated so that the top metal electrode 16 for each LED is small to allow light to exit the top surface of the LEDs. The bottom metal electrode 18 is reflective (a mirror) and should have a reflectivity of over 90% for visible light. There is some side light, depending on the thickness of the LED. In the example, the anode electrode is on top and the cathode electrode is on the bottom.

The LEDs are completely formed on the wafer, including the anode and cathode metallizations, by using one or more carrier wafers during the processing and removing the growth substrate to gain access to both LED surfaces for metallization. The LED wafer is bonded to the carrier wafer using a dissolvable bonding adhesive. After the LEDs are formed on the wafer, trenches are photolithographically defined and etched in the front surface of the wafer around each LED, to a depth equal to the bottom electrode, so that each LED has a diameter of less than 50 microns and a thickness of about 4-8 microns, making them essentially invisible to the naked eye. A preferred shape of each LED is hexagonal. The trench etch exposes the underlying wafer bonding adhesive. The bonding adhesive is then dissolved in a solution to release the LEDs from the carrier wafer. Singulation may instead be performed by thinning the back surface of the wafer until the LEDs are singulated. The LEDs 14 of FIG. 1 result, depending on the metallization designs. The microscopic LEDs 14 are then uniformly infused in a solvent, including a viscosity-modifying polymer resin, to form an LED ink for printing, such as screen printing, or flexographic printing.

The LED ink is then printed over the conductor layer 12. The orientation of the LEDs 14 can be controlled by providing a relatively tall top electrode 16 (e.g., the anode electrode), so that the top electrode 16 orients upward by taking the fluid path of least resistance through the solvent after printing. The anode and cathode surfaces may be opposite to those shown. The LED ink is heated (cured) to evaporate the solvent. After curing, the LEDs remain attached to the underlying conductor layer 12 with a small amount of residual resin that was dissolved in the LED ink as a viscosity modifier. The adhesive properties of the resin and the decrease in volume of resin underneath the LEDs 14 during curing press the bottom cathode electrode 18 against the underlying conductor layer 12, creating a good electrical connection. Over 90% like orientation has been achieved, although satisfactory performance may be achieved with over 75% of the LEDs being in the same orientation.

A transparent polymer dielectric layer 19 is then selectively printed over the conductor layer 12 to encapsulate the sides of the LEDs 14 and further secure them in position. The ink used to form the dielectric layer 19 pulls back from the upper surface of the LEDs 14, or de-wets from the top of the LEDs 14, during curing to expose the top electrodes

16. If any dielectric remains over the LEDs 14, a blanket etch step may be performed to expose the top electrodes 16.

A transparent conductor layer 20 is then printed to contact the top electrodes 16. The conductor layer 20 is cured by lamps to create good electrical contact to the electrodes 16.

The LEDs 14 in the monolayer, within a defined area, are connected in parallel by the conductor layers 12/20 since the LEDs 14 have the same orientation. Since the LEDs 14 are connected in parallel, the driving voltage must approximately equal the voltage drop of a single LED 14.

A flexible, polymer protective layer 22 may be printed over the transparent conductor layer 20. If wavelength conversion is desired, a phosphor layer may be printed over the surface. The phosphor layer may comprise phosphor powder (e.g. a YAG phosphor) in a transparent flexible binder, such as a resin or silicone.

The flexible light sheet 10 of FIG. 1 may be any size and may even be a continuous sheet formed during a roll-to-roll process that is later stamped out for a particular application.

FIGS. 1 and 2 also illustrate how the thin conductor layers 12 and 20 on the light sheet 10 may be electrically contacted along their edges by metal bus bars 24-27 that are printed and cured to electrically contact the conductor layers 12 and 20. The metal bus bars along opposite edges are shorted together by a printed metal portion outside of the cross-section. The structure may have one or more conductive vias 30 and 32 (metal filled through-holes), which form a bottom anode lead 34 and a bottom cathode lead 36 so that all electrical connections may be made from the bottom of the substrate 11. Instead of vias, the top metal may be connected to the bottom metal by other means, such as metal straps extending over the edges of the light sheet. A suitable voltage differential applied to the leads 34 and 36 turns on the LEDs 14 to emit light through one or both surfaces of the light sheet 10.

FIG. 2 is a top down view of the light sheet 10 of FIG. 1, where FIG. 1 is taken along line 1-1 in FIG. 2. If the light sheet 10 is wide, there will be a significant IR drop across at least the transparent conductor layer 20. Thin metal runners 38 may be printed along the surface of the conductor layer 20 between the opposing bus bars 24 and 25 to cause the conductor layer 20 to have a more uniform voltage, resulting in more uniform current spreading. In an actual embodiment, there may be thousands of LEDs 14 in a light sheet 10.

One problem encountered with the light sheet 10 is that the various interfaces of different indices of refraction, such as the interface of air and the top polymer layer 22, are flat and parallel and internally reflect light when the incident light ray is greater than the critical angle. This creates waveguiding, where light is trapped in the flat layers and eventually absorbed. Two such light rays 40 and 42 are shown. Light ray 43 shows an internal reflection off the bottom surface of the layer 22. With each reflection, the light becomes absorbed somewhat, leading to a decrease in light extraction efficiency.

What is needed is a technique for increasing the light extraction efficiency of the printed structure of FIGS. 1 and 2 that is compatible with the existing fabrication process.

SUMMARY

In one embodiment, instead of a flat printed protective layer over the printed LEDs, a transparent polymer layer is molded over the surface of the light sheet to have prisms, cones, bumps, or other features that create a more normal angle of incidence to the light emitted by the LEDs. This results in more light being incident at the air/polymer interface at less than the critical angle, so less internal reflection results.

The molding may be by compression molding, injection molding, stamping, rolling, or other technique. The molding may occur after a polymer layer is deposited over the surface of the light sheet.

In another embodiment, the top polymer sheet having the features is laminated over the LED layer.

In another embodiment, a hydrophobic mask layer is formed over the light sheet, where the mask has an array of small circular holes. A transparent liquid that is phobic to the mask layer is then deposited over the mask layer. The phobic liquid will generally form hemispheres in the holes. The liquid is then cured.

Other techniques of forming features in a transparent layer are disclosed.

Since the LEDs are generally randomly printed on the substrate, and the features in the transparent layer will typically be an ordered array, the features will not align with the LEDs. Therefore, the features must be designed to increase light extraction whether or not the features are aligned with the LEDs. Typically, a single feature width will be much larger than the width of a single LED, and the light from multiple LEDs may pass through a single feature.

In one embodiment, the transparent dielectric layer that encapsulates the sides of the LEDs is a polymer having a certain index of refraction. To avoid a reflective interface between two materials of different indices of refraction, the top layer having the features preferably has the same index as the dielectric layer, and may be the same material. The transparent conductive layer may comprise silver nano-wires, where the solvent has been evaporated away, leaving sintered, overlapping nano-wires with large openings between the wires. The top polymer layer with the features is then deposited to directly contact the surface of the dielectric layer through the openings between the nano-wires so there is no intermediary layer. This maximizes the light extraction of the light sheet.

In another embodiment, the transparent substrate, over which the LEDs are printed, has the light extraction features formed in it. In such a case, the conductor layer over the substrate is transparent. Preferably, the substrate has an index of refraction similar to that of the dielectric layer or slightly greater. The dielectric layer may directly contact the substrate through openings in the transparent conductor layer.

In another embodiment, the top and bottom surfaces of the light sheet may be light emitting surfaces, and the light extraction features are formed on both surfaces.

In another embodiment, groups of the LEDs are printed on a transparent conductor layer on designated areas of a transparent substrate to form an array of groups of the LEDs. Each group includes a random distribution of LEDs, such as 10-100 LEDs in a group. A dielectric layer is then formed to encapsulate the sides of the LEDs and extend between the groups of LEDs. The dielectric layer has an index of refraction about the same as the substrate. A reflective conductor layer is then formed to sandwich the LEDs between the two conductor layers to connect the LEDs in parallel. The flat light sheet is then molded, such as using a heated mold so that each group of LEDs is at the bottom of a reflective cup formed by the molded reflective conductor layer. The substrate is the light emitting surface. The angled surfaces of the substrate and the reflective conductor layer greatly reduce waveguiding within the transparent substrate and dielectric layer. Additionally, a transparent layer is formed over the substrate that includes rounded bumps, prisms, or other optical features to further increase light extraction at the air interface. An additional layer may be molded over the reflective conductor layer for mechanical support and/or as a protective layer.

The LEDs may instead be formed using other techniques and may be much larger or smaller. The lamps described herein may be constructed by techniques other than printing.

Other embodiments are contemplated and described.

BRIEF DESCRIPTION OF THE DRAWINGS

FIG. 1 is taken along line 1-1 in FIG. 2.

Elements that are similar or identical in the various figures are labeled with the same numeral.

DETAILED DESCRIPTION

Figure 2:
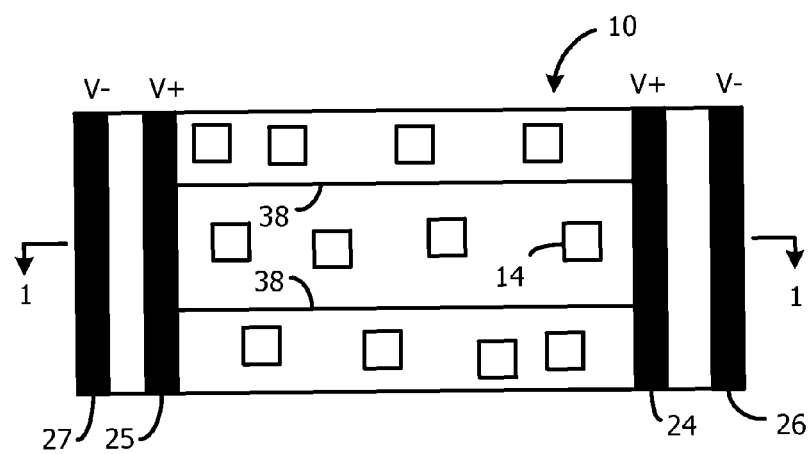
FIG. 2 is a top down view of the structure of FIG. 1, where
Figure 3:
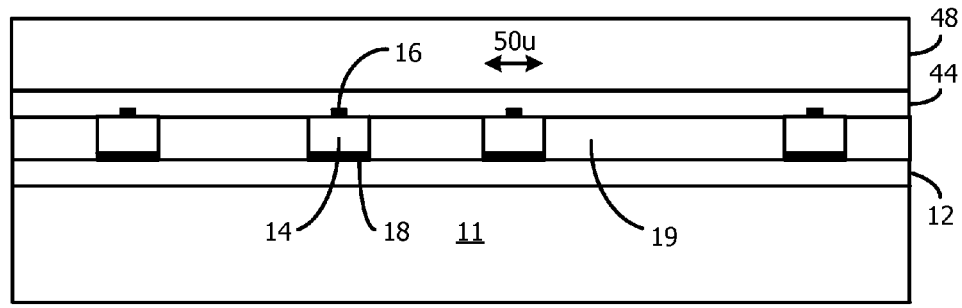
FIG. 3 is a cross-section of a light sheet with a transparent moldable layer formed over a transparent conductor layer.

FIG. 3 is a cross-section of a light sheet having a substrate 11, a reflective conductor layer 12, a monolayer of vertical LEDs 14 with electrodes 16 and 18, and a transparent dielectric layer 19. This portion of the structure of FIG. 3 may be identical to the corresponding structure of FIG. 1 and may be formed in the same way. Metal bus bars and metal leads are not shown for simplicity and may be identical to those described with respect to FIGS. 1 and 2.

Figure 1:
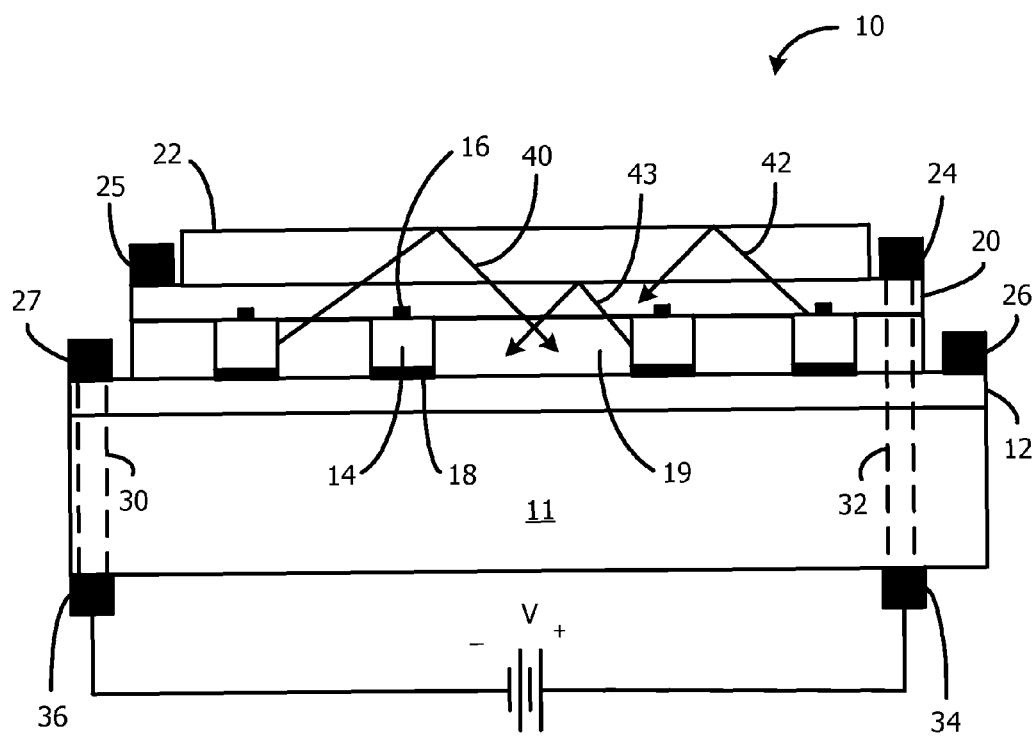
FIG. 1 is a cross-section of a prior art thin, flexible light sheet.

The LEDs 14 are printed in a solution in the manner described with respect to FIG. 1 so the arrangement of the LEDs 14 on the conductor layer 12 will be substantially random.

In one embodiment, the LEDs 14 are GaN-based and emit blue light. A phosphor layer may be applied over the various structures to convert the blue light to yellow, or red and green, to create white light. The number of LEDs 14 per unit area is generally selected to provide a target brightness per unit area for the intended drive current.

The dielectric layer 19 material is a polymer that has a certain index of refraction between the index of the LED material and air.

Figure 4:
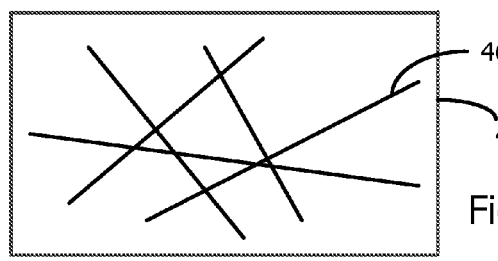
FIG. 4 is a top down view of a small portion of the transparent conductor layer, showing sintered silver nano-wires having large openings between the wires.

A transparent conductor layer 44 is deposited over the LEDs 14 and the dielectric layer 19. In the preferred embodiment, the transparent conductor layer 44 comprises silver nano-wires in a solvent. The mixture is printed over the LEDs 14 and dielectric layer 19 and heated to evaporate the solvent. The silver nano-wires randomly overlap and are sintered together by heat to form a very porous transparent conductor layer 44. FIG. 4 is a top down view of a very small portion of the transparent conductor layer 44 showing silver nano-wires 46 overlapping and sintered together to form a conductive mesh. As seen, a large percentage of the mesh is made up of the openings between the nano-wires 46. Other types of metal nano-wires may also be used. Silver nano-wire materials are commercially available, and the density of the nano-wires 46 may be selected by the thickness of the deposited mixture and/or the density of the nano-wires 46 in the mixture.

If the solvent containing the silver nano-wires cannot be completely evaporated, the remaining solvent should have an index of refraction close to or the same as the dielectric layer 19 to minimize waveguiding.

Next, a polymer top layer 48 is printed, or otherwise deposited, over the transparent conductor layer 44 to make direct contact with the dielectric layer 19 through the openings in the nano-wires 46. The layer 48 may be the same material as the dielectric layer 19 or otherwise have the same or similar index of refraction as the dielectric layer 19. The index will be about 1.5-1.7 for a typical polymer, while the index of the LEDs 14 is about 2.5 and the index of air is 1. The index of the layer 48 is preferable the same as or slightly higher than the index of the dielectric layer 19 to minimize internal reflections. The layer 48 will meld to the dielectric layer 19 through the openings in the nano-wire mesh so there will not be any significant interface between the dielectric layer 19 and the top layer 48 that reflects light.

The top layer 48 may initially be a liquid polymer or a paste that is printed, sprayed, or rolled on the transparent conductor layer 44. Alternatively, the top layer 48 may be a thermoplastic polymer sheet that is laminated over the transparent conductor layer 44 and later heated during the molding step.

The thickness of the top layer 48 may be only a few mils, such as 5-20 mils.

Figure 5:
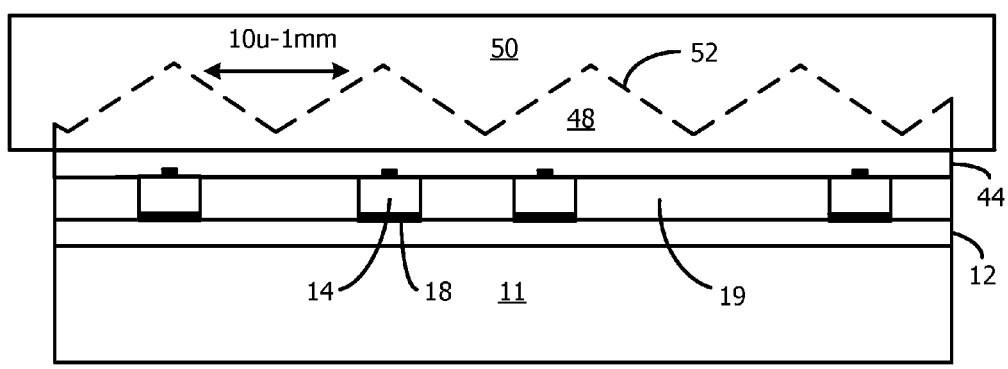
FIG. 5 illustrates the structure of FIG. 3 being subjected to a molding process to form light extraction features, such as cones or prisms, in the top layer.

As shown in FIG. 5, a mold 50 is brought against the top surface to create a feature pattern in the top layer 48. In the example of FIG. 5, the mold 50 forms a cone array or pyramid array, shown by the dashed line 52. In one embodiment, the features are in an ordered array. Since the LEDs 14 are randomly distributed and each feature will typically be much larger than a single LED, the features will typically not align with the LEDs. In one embodiment, the feature widths are many times larger than the widths of the LEDs, such as 5-20 times larger. Smaller feature widths generally result in a thinner top layer 48 but may be more difficult to mold.

Most of the light that is emitted from the LEDs 14 is not vertical but at an angle. Since the air/layer 48 interface is angled, there is a higher likelihood that an incident light ray will be at less than the critical angle and not be reflected by TIR (total internal reflection). In one embodiment, there are no flat air/top layer 48 interfaces to reduce waveguiding even if there are one or more internal reflections.

The layer 48 is cured by heating, cooling, or UV, depending on the material, and the structure is removed from the mold 50.

Figure 6:
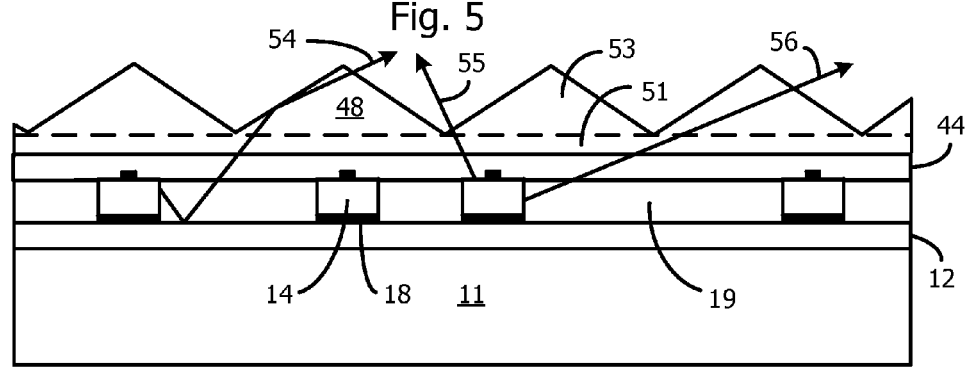
FIG. 6 illustrates the resulting light sheet after the molding process.

FIG. 6 illustrates the molded layer 48 and light rays 54-56 from the LEDs 14 exiting through the angled surfaces within one reflection off the air/layer 48 interface. Any offset between a feature and the center of an LED 14 does not matter.

Multiple polymer layers with a graded index, starting from the index of the dielectric layer 19 to a lower index at the air/layer 48 interface, may be deposited over the transparent conductor layer 44 and then molded to reduce the differences in indices at the various interfaces to improve light extraction. In the example of FIG. 6, the molded layer 48 includes a lower layer 51, having an index of refraction substantially the same as, or similar to, the dielectric layer 19, and an upper layer 53 having a lower index closer to that of air.

In another embodiment, the layer 48 may be a thermoplastic that is laminated on as a sheet, and then a heated mold 50 is pressed down on the layer 48 to form the features.

Figure 7:
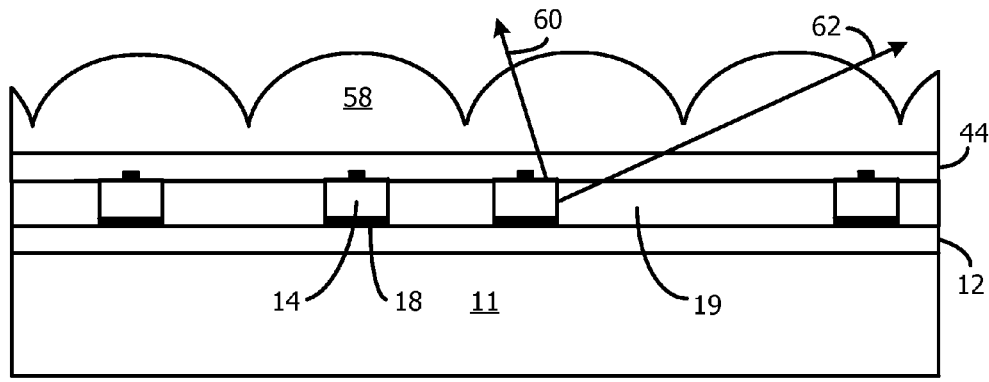
FIG. 7 illustrates hemispherical bumps that have been molded using a molding process similar to that shown in FIG. 5 for improving light extraction.

FIG. 7 illustrates that the molded features in the transparent layer 58 may be generally hemispherical bumps. Light rays 60 and 62 are shown exiting the layer 58 without any internal reflection.

Figure 8:
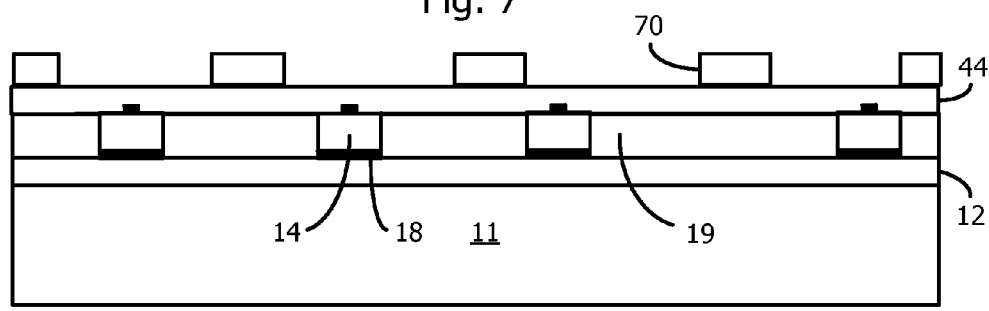
FIG. 8 is a cross-section of a light sheet having a hydrophobic mask that has been printed over the light sheet surface.
Figure 9:
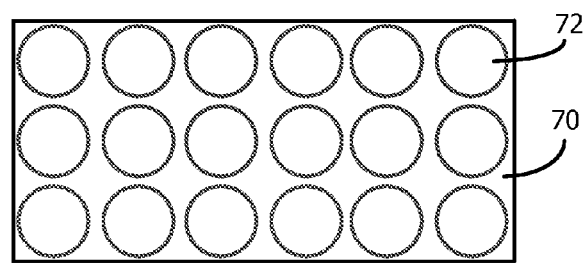
FIG. 9 is a top down view of a small portion of the mask of FIG. 8 showing circular openings in the mask.

FIG. 8 illustrates printing a transparent hydrophobic mask 70 over the surface of the transparent conductor layer 44. FIG. 9 is a top view of a portion of the mask 70 showing that circular holes 72 are created by the mask 70. Suitable hydrophobic materials are well-known.

Figure 10:
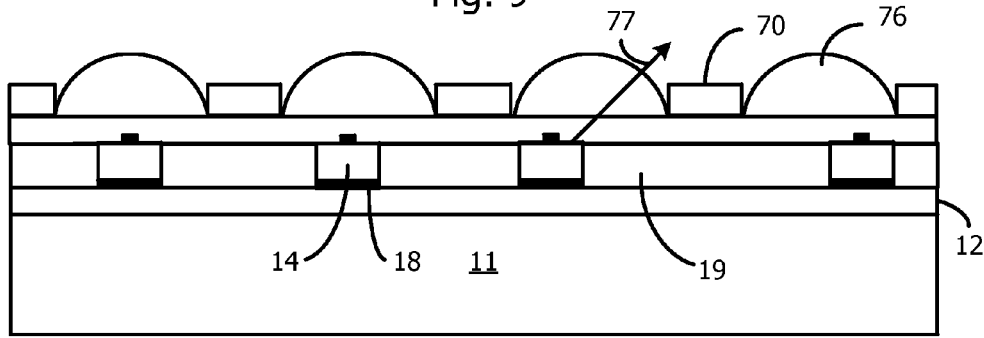
FIG. 10 illustrates a transparent liquid that has beaded up in the circular openings of the mask to form generally hemispherical bumps after curing for improving light extraction.

In FIG. 10, a liquid polymer is blanket deposited over the mask 70 to a certain thickness, such as by printing or spraying, and the polymer pools in the circular openings by capillary action to generally form hemispherical bumps 76. The polymer is phobic to the mask 70 and has about the same index of refraction as the dielectric layer 19. The polymer is then cured. The mask 70 may be removed or remain as a protective layer between the bumps 76. Smaller diameter holes will generally result in the bumps 76 being more hemispherical. The phobicity of the mask 70 may be enhanced by using a plasma, corona, or other treatment. A light ray 77 is shown exiting through one of the bumps 76.

Figure 11:
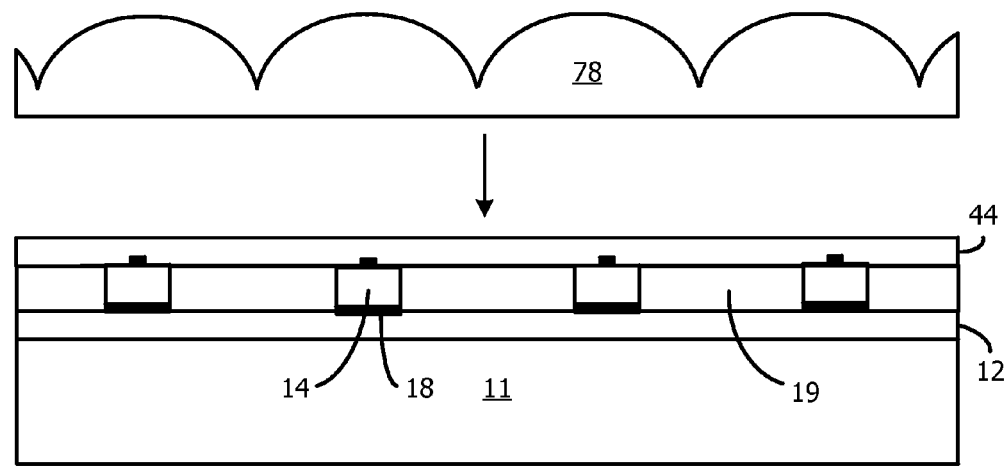
FIG. 11 is a cross-section of a light sheet and a top layer that is being laminated onto the light sheet for improving light extraction.

FIG. 11 illustrates a flexible, transparent polymer layer 78 that has been pre-formed by molding or stamping. The layer 78 is then laminated over the light sheet and heated to meld the layer 78 to the dielectric layer 19, having a similar index of refraction.

The light extraction features may be ordered or pseudo-random to avoid perceptible patterns.

Figure 12:
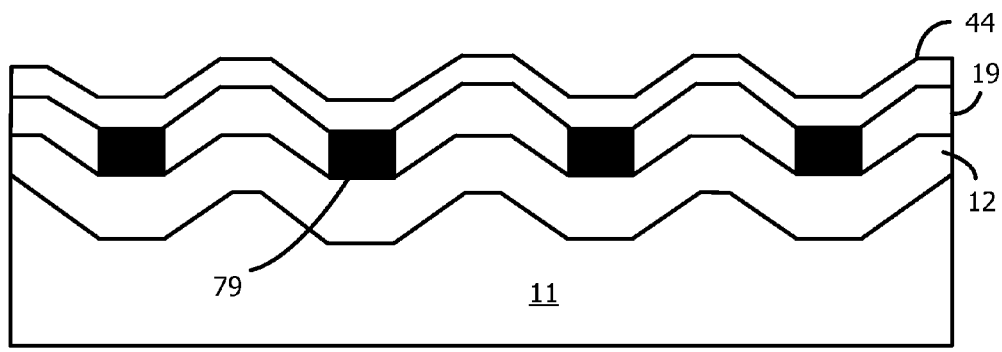
FIG. 12 is a cross-section of a light sheet where groups of LEDs are printed in reflective cups formed in a molded substrate, where the reflective cups redirect light toward the light emitting surface, and the angled surfaces of the transparent layers reduce waveguiding for improving light extraction.

FIG. 12 illustrates how the top surface of the polymer substrate 11 is first molded to form angled features. The deposition of the thin reflective conductor layer 12 will then follow the contours of the features. Alternatively, the molding is performed after the conductor layer 12 is deposited. In the embodiment shown, the molded features form reflective cups, which may have angled flat or rounded surfaces. In one embodiment, the features are much larger than the individual LEDs so that groups 79 of LEDs are printed at the bottom of each reflective cup. There will typically be 10-100 randomly distributed LEDs in each cup. The angled surfaces will scatter the light from the LEDs to prevent waveguiding.

A dielectric layer 19 is then deposited to encapsulate the sides of the LEDs. A transparent conductor layer 44 is then printed, which will follow the angled contours and connect the LEDs in parallel.

Figure 13:
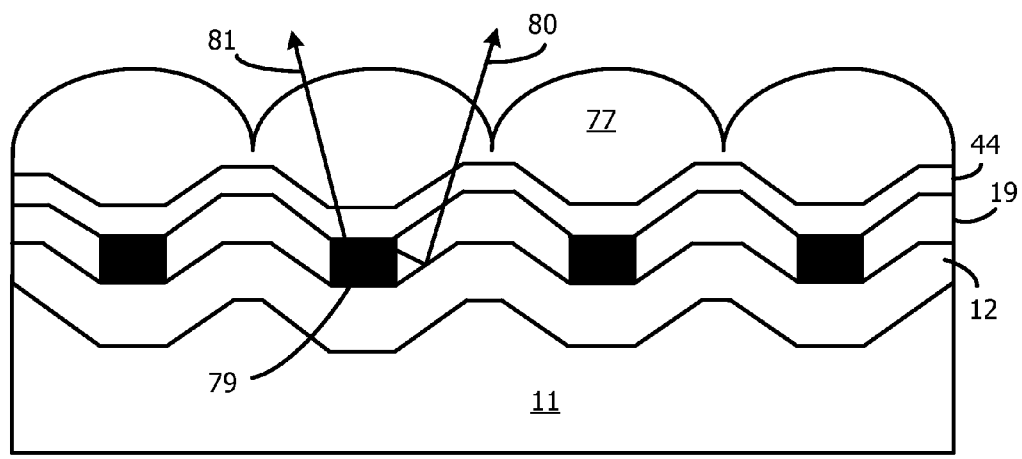
FIG. 13 illustrates the light sheet of FIG. 12 having a light emission surface with rounded features to further improve light extraction.

In FIG. 13, a top transparent layer 77 is formed that has rounded or other angled features to increase light extraction. In one embodiment, the layer is deposited and then molded. In another embodiment, the layer 77 is deposited as a liquid and pools in the indentations under surface tension to form the rounded bumps. The layer 77 is then cured. Light rays 80 and 81 are shown.

By using a transparent film as the substrate 11 and making either or both of the conductor layers transparent, light may exit through either surface, or both surfaces, simultaneously. Therefore, both surfaces of the light sheet may be molded simultaneously to have the light extraction features described herein. Generally, both surfaces will interface with air. In another embodiment, the top conductor layer is reflective and all light exits the light sheet through the substrate 11.

If the LEDs are GaN-based and emit blue light, a phosphor layer (e.g., YAG) may be deposited over the light emitting surface(s) to cause the light sheet to emit any color light, such as white light. The phosphor layer may conform to the outer dimensions of the features since the thickness of the phosphor layer should be substantially uniform. If the features are small enough, the phosphor layer will essentially be planar. The light sheets may be formed to have a thickness between about 5-13 mils (125-325 microns), including the phosphor layer.

In FIGS. 14-17, the transparent substrate 11 is molded to have light extraction features, and the LEDs 14 emit light through the molded substrate 11.

Figure 14:
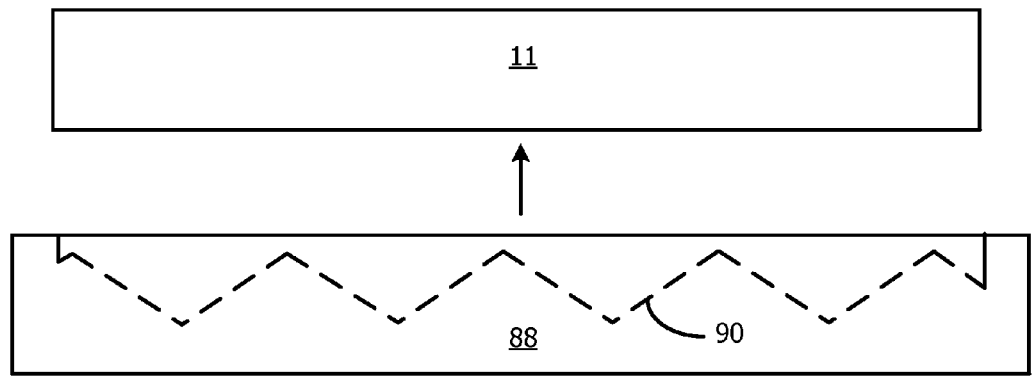
FIGS. 14 and 15 illustrate how the light emitting surface is the transparent substrate surface and the substrate surface is molded to have light extraction features.
Figure 15:
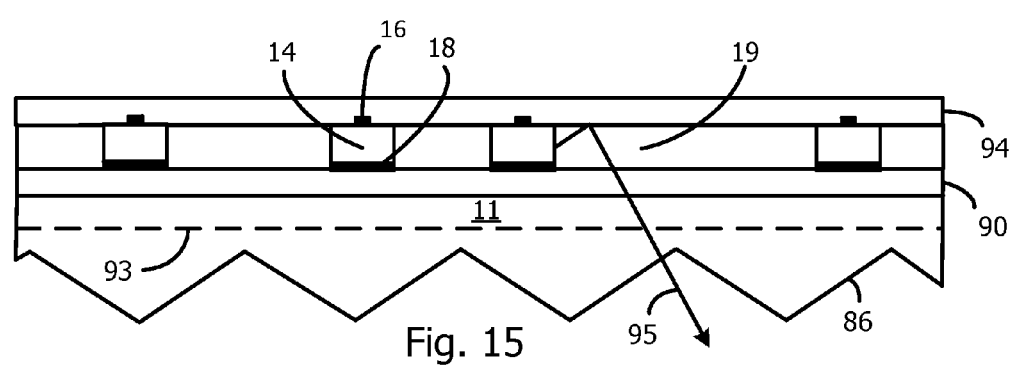

In FIG. 14, a transparent substrate 11, such as PET, is provided with a thickness of 150-200 microns. The substrate 11 is molded, stamped, extruded, or otherwise formed to have a bottom surface with light extraction features 86 (FIG. 15). The features 86 may be formed by a heated mold 88 having an indentation pattern 90. The mold 88 may be a roller. The substrate 11 may be molded prior to layers being printed over it or after the layers are formed. The indentions may be rounded, or prisms, or cones, or other shapes. The indentions may be ordered or pseudo-random. Each feature 86 may be larger than an individual LED 14.

In FIG. 15, a transparent conductor layer 90 is then printed over the flat upper surface of the substrate 11. The conductor layer 90 may be the sintered silver nano-wires 46 shown in FIG. 4, having openings between the wires 46.

The LEDs 14 are then printed, as previously discussed, where the bottom electrodes 18 become electrically connected to the conductor layer 90.

A dielectric layer 19 is then printed over the conductor layer 90 to encapsulate the sides of the LEDs 14. The dielectric layer 19 is applied as a liquid or a paste and directly contacts the substrate 11 through the openings in the conductor layer 90. The index of refraction of the dielectric layer 19 is preferably the same as or slightly greater than the index of the substrate 11 so there is little or no difference in the indices at the interface, resulting in little or no internal reflection. The dielectric layer 19 material may be the same as the substrate 11 material.

Figure 16:
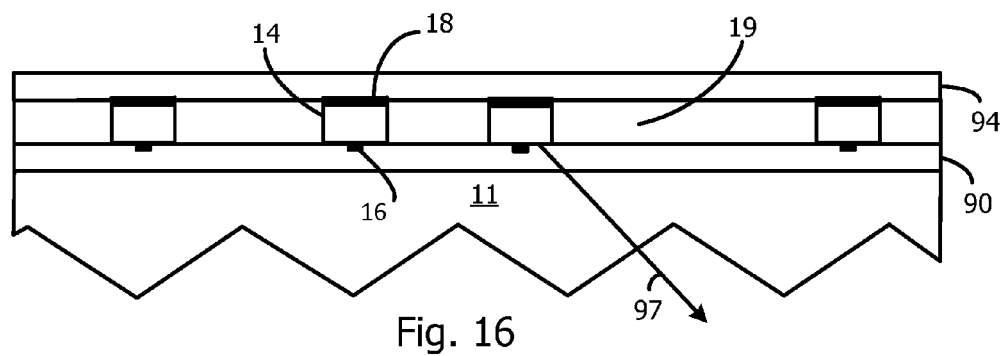
FIG. 16 illustrates how the LEDs may have the large reflective electrode on the top.

A reflective conductor layer 94, such as a silver layer, is then printed over the surface to electrically contact the top electrodes 16. The orientations of the LEDs 14 may be reversed as shown in FIG. 16.

Accordingly, when the LEDs 14 are energized by a voltage applied across the conductor layers 90 and 94, any upward LED light ray 95 will reflect off the conductor layer 94 toward the substrate 11. There will be little reflection at the dielectric/substrate interface. Since the air/substrate interface is textured, there will be little internal reflection at that interface. FIG. 16 shows a light ray 97 directly exiting the light sheet from the LED 14 without reflection.

The reflective conductor layer 94 may be molded like the conductor layer 12 in FIG. 12 to reflect light at a more normal angle toward the substrate 11 to reduce internal reflections.

In another embodiment, the conductor layer 94 is transparent (e.g., silver nano-wires), and a reflective layer is deposited over the transparent conductor layer.

In another embodiment, the malleable polymer layer 48 in FIG. 3 is deposited on a flat bottom surface of the substrate 11 and then molded to have the light extraction features. The index of the molded layer and the substrate 11 should be similar to reduce internal reflections at the interface. Preferably the index of the molded layer is less than that of the substrate. In FIG. 15, the interface between the substrate 11 and the molded polymer layer is shown by the dashed line 93. The layer may be molded over the substrate 11 prior to layers being printed on the substrate 11 or after.

Figure 17:
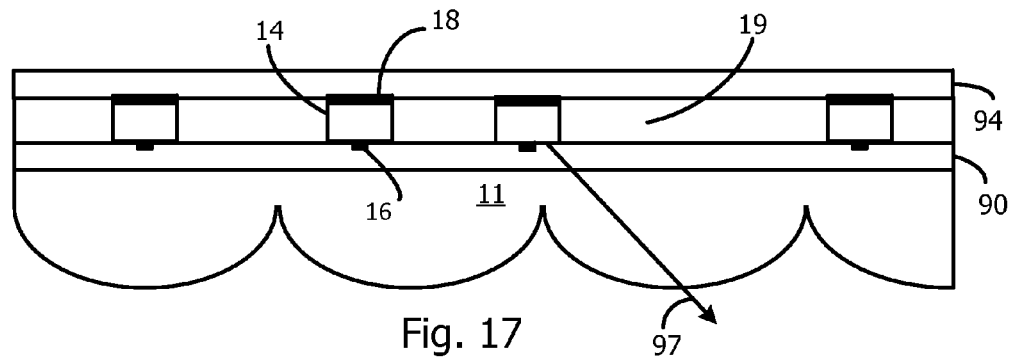
FIG. 17 illustrates the substrate having rounded bumps for increasing light extraction.

FIG. 17 illustrates how the substrate 11 may be textured to have a rounded bump surface of increasing light extraction.

Figure 18:
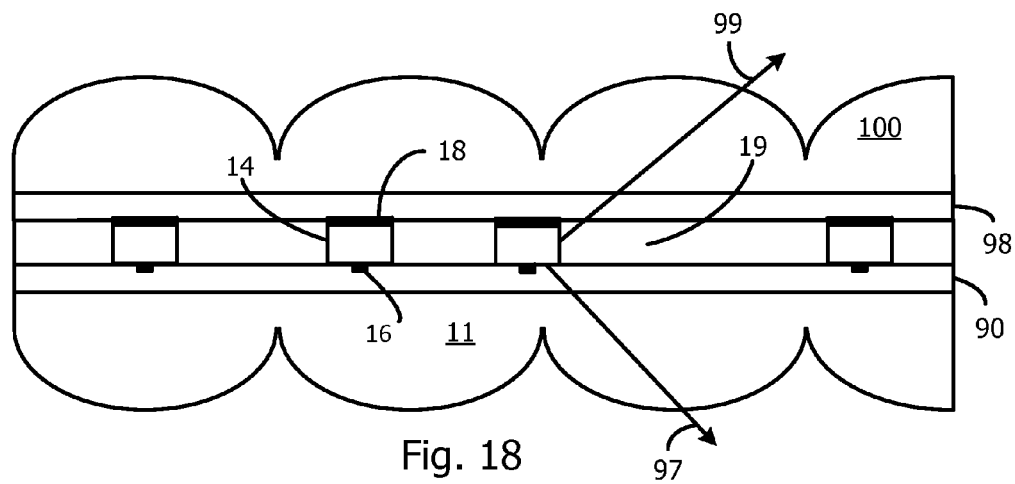
FIG. 18 illustrates two-sided emission from the light sheet where both emission surfaces are textured to increase light extraction.

FIG. 18 illustrates the upper and lower conductor layers 90 and 98 being transparent conductor layers, such as the sintered silver nano-wires. The substrate 11 is molded, as in FIG. 17, and a transparent top layer 100 is deposited and molded in the way that the layer 48 was molded in FIG. 5. The top layer 100 is deposited as a liquid or paste and contacts the dielectric layer 19 through the openings in the conductor layer 98. The indices of the two materials are the same or similar so there is little internal reflection. If the indices are not the same, the dielectric layer 19 should have the higher index. The texturing of the light emitting surfaces reduces internal reflections at the air interface. Light rays 97 and 99 are shown. Prototypes of various embodiments have been built or simulated, and the light extraction has increased from about 10-20% without the light extraction features to over 50% with the light extraction features.

A layer of phosphor, such as YAG, can be deposited over the light emitting surface(s) to convert the blue LED light to white light for general illumination, backlighting, or any other application. The index of refraction of the phosphor layer is preferably similar to the underlying light extraction layer to minimize internal reflections. The phosphor layer should have uniform thickness and will conform to the light extraction features if the features are large enough. Therefore, the phosphor layer will also possess the light extraction features to improve the light extraction at the phosphor layer/air interface.

Figure 19:
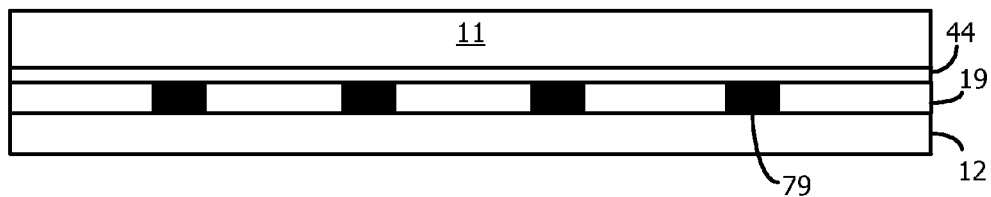
FIG. 19 illustrates printing groups of LEDs in designated areas over a substrate and a reflective conductor layer.
Figure 20:
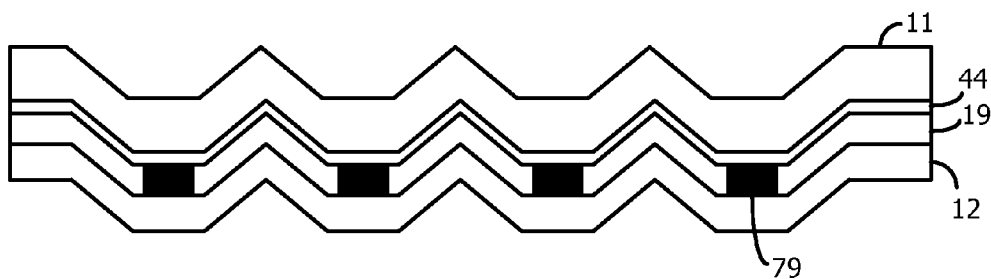
FIG. 20 illustrates molding the flat light sheet to form reflective cups, where the reflective cups redirect light toward the light emitting surface, and the angled surfaces of the transparent layers reduce waveguiding for improving light extraction.
Figure 21:
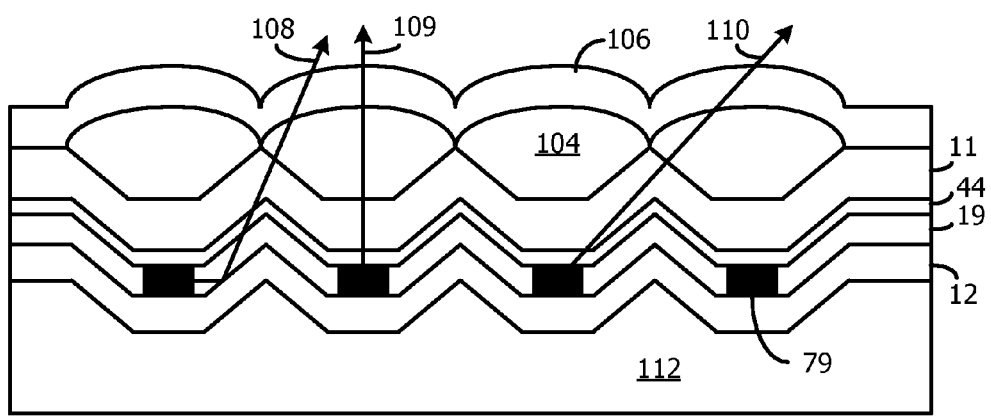
FIG. 21 illustrates the light sheet of FIG. 20 having a light emission surface with rounded features to further improve light extraction. A phosphor layer is also shown.

FIGS. 19-21 illustrate another embodiment.

In FIG. 19, groups 79 of the microscopic LEDs are printed on a transparent conductor layer 44 on designated areas of a transparent substrate 11 to form an array of groups 79 of the LEDs. The transparent conductor layer 44 may be sintered silver nano-wires. Each group 79 includes a random distribution of LEDs, such as 10-100 LEDs in a group. A dielectric layer 19 is then formed to encapsulate the sides of the LEDs and extend between the groups 79 of LEDs. The dielectric layer 19 has an index of refraction about the same as the substrate 11 and may directly contact the substrate 11 through openings in the transparent conductor layer 44.

A reflective conductor layer 12, such as silver, is then formed to sandwich the LEDs between the two conductor layers to connect the LEDs in parallel.

In FIG. 20, the flat light sheet is then molded, such as by using a heated mold under pressure, so that each group 79 of LEDs is at the bottom of a reflective cup formed by the molded reflective conductor layer 12. The substrate 11 is the light emitting surface. The angled surfaces of the substrate 11 and the reflective conductor layer 12 greatly reduce waveguiding within the transparent substrate 11 and dielectric layer 19. The cups may have angled flat sides or have rounded sides. The groups 79 of LEDs may be deposited in circular or square areas and have a diameter or sides on the order of 1-3 mm. The pitch of the groups 79 may be around 3-6 mm, which will also be the pitch of the reflective cups.

In FIG. 21, a transparent layer 104 is formed over the substrate 11 so as to have rounded bumps, prisms, or other optical features to further increase light extraction at the air interface. In one embodiment, the layer 104 is deposited and then molded. In another embodiment, the layer 104 is deposited as a liquid and pools in the indentations under surface tension to form the rounded bumps. The layer 104 is then cured. The layer 104 may be silicone or other suitable polymer. The index of refraction of the layer 104 should be the same as or similar to that of the substrate 11 to minimize internal reflections at the interface.

A conformal phosphor layer 106, such as YAG, is then deposited over the layer 104, such as by spraying or printing, to convert some of the blue LED light to yellow light so that the combined light appears white. The thickness of the phosphor layer 106 and density of the phosphor powder determines the percentage of blue light that leaks through. The index of refraction of the phosphor layer 106 should be similar to that of the layer 104 to minimize internal reflections at the interface.

Light rays 108-110 are shown.

An additional layer 112 may be molded over the reflective conductor layer 12 for mechanical support and/or as a protective layer.

Other embodiments are contemplated. Any of the elements in the various embodiments may be combined in a single light sheet.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light sheet comprising:
a substrate;
a first conductor layer over the substrate;
a layer of microscopic inorganic light emitting diodes (LEDs) deposited on the first conductor layer so that a bottom electrode of the LEDs electrically contacts the first conductor layer, wherein the LEDs are randomly distributed on the first conductor layer;
a first dielectric layer, having a first index of refraction, deposited over the first conductor layer and along sidewalls of the LEDs;
a second conductor layer over the LEDs so that a top electrode of the LEDs electrically contacts the second conductor layer, wherein at least one of the first conductor layer or the second conductor layer is transparent; and
a light extraction layer overlying the first conductor layer or the second conductor layer, the light extraction layer having a second index of refraction substantially the same as or less than the first index of refraction, wherein a light emitting surface of the light extraction layer includes identical repeated features having a plurality of angles to reduce total internal reflection at the light emitting surface of the light extraction layer,
wherein the features comprise an array of the identical repeated features, and
wherein a width of each of the features is larger than a width of a single one of LEDs such that multiple LEDs are randomly distributed under a single feature, and the light from the multiple LEDs pass through each feature.

2. The light sheet of claim 1 wherein the first conductor layer is transparent.

3. The light sheet of claim 1 wherein the second conductor layer is transparent.

4. The light sheet of claim 1 wherein the first conductor layer and the second conductor layer are transparent.

5. The light sheet of claim 1 wherein the first conductor layer is transparent and has openings exposing the first dielectric layer, wherein the light extraction layer directly contacts the first dielectric layer through the openings.

6. The light sheet of claim 5 wherein the first conductor layer comprises sintered metal wires forming a mesh with openings, wherein the light extraction layer contacts the first dielectric layer through the openings.

7. The light sheet of claim 1 wherein the second conductor layer is transparent and has openings exposing the first dielectric layer, wherein the light extraction layer directly contacts the first dielectric layer through the openings.

8. The light sheet of claim 7 wherein the second conductor layer comprises sintered metal wires forming a mesh with openings, wherein the light extraction layer contacts the first dielectric layer through the openings.

9. The light sheet of claim 1 wherein the light extraction layer comprises a light emitting surface of the substrate.

10. The light sheet of claim 1 wherein the light extraction layer overlies the second conductor layer.

11. The light sheet of claim 1 wherein the light extraction layer has a lower index of refraction than the first dielectric layer.

12. The light sheet of claim 1 wherein the features form an ordered array of features.

13. The light sheet of claim 1 wherein the features form a pseudo-random array of features.

14. The light sheet of claim 1 wherein the features are molded into the light extraction layer after the light extraction layer is provided adjacent the first conductor layer or the second conductor layer.

15. The light sheet of claim 1 wherein the light extraction layer is laminated over the first conductor layer or the second conductor layer.

16. The light sheet of claim 1 wherein the features comprise prisms.

17. The light sheet of claim 1 wherein the features comprise rounded bumps.

18. The light sheet of claim 1 wherein the features comprise cones.

19. The light sheet of claim 1 wherein the light extraction layer comprises a plurality of layers having a graded index of refraction, where a first layer in the plurality has the second index of refraction substantially the same as the first index of refraction, and a second layer in the plurality forming the top surface of the light extraction layer has a third index of refraction lower than the second index of refraction.

20. The light sheet of claim 1 wherein the substrate and first conductor layer are formed to create an array of reflective cups,
wherein the layer of LEDs comprises groups of LEDs, where each group of LEDs is printed in a separate reflective cup, and the LEDs in each group are connected in parallel by the first conductor layer and the second conductor layer,
wherein the light extraction layer is formed over the substrate to fill the reflective cups.

* * * * *